United States Patent
Satoh et al.

(10) Patent No.: US 12,356,788 B2
(45) Date of Patent: Jul. 8, 2025

(54) LIGHT EMITTING DEVICE AND METHOD FOR MANUFACTURING LIGHT EMITTING DEVICE

(71) Applicant: SHARP KABUSHIKI KAISHA, Sakai (JP)

(72) Inventors: Eiji Satoh, Sakai (JP); Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 704 days.

(21) Appl. No.: 17/641,677

(22) PCT Filed: Sep. 19, 2019

(86) PCT No.: PCT/JP2019/036784
§ 371 (c)(1),
(2) Date: Mar. 9, 2022

(87) PCT Pub. No.: WO2021/053793
PCT Pub. Date: Mar. 25, 2021

(65) Prior Publication Data
US 2022/0328779 A1    Oct. 13, 2022

(51) Int. Cl.
*H10K 50/115*     (2023.01)
*H10K 59/80*      (2023.01)
*H10K 71/00*      (2023.01)

(52) U.S. Cl.
CPC ......... *H10K 50/115* (2023.02); *H10K 59/879* (2023.02); *H10K 71/00* (2023.02)

(58) Field of Classification Search
CPC .... H10K 50/115; H10K 71/00; H10K 59/879; H05B 33/14
See application file for complete search history.

(56) References Cited

U.S. PATENT DOCUMENTS

| | | |
|---|---|---|
| 2013/0270517 A1* | 10/2013 | Nozawa ................. H01L 29/15 257/15 |
| 2014/0014985 A1* | 1/2014 | Sonoda ................ H10K 59/351 257/89 |
| 2019/0363150 A1* | 11/2019 | Nomura ............... H10K 59/121 |
| 2020/0075876 A1* | 3/2020 | Zhu ........................ H05B 33/14 |
| 2020/0136075 A1 | 4/2020 | Kanehiro et al. |
| 2021/0028385 A1 | 1/2021 | Sakakibara et al. |
| 2021/0135137 A1 | 5/2021 | Tsukamoto et al. |

FOREIGN PATENT DOCUMENTS

| | | |
|---|---|---|
| JP | 2007-080890 A | 3/2007 |
| WO | 2015/163379 A1 | 10/2015 |
| WO | 2018/235727 A1 | 12/2018 |
| WO | 2019/049191 A1 | 3/2019 |
| WO | 2019/186896 A1 | 10/2019 |

\* cited by examiner

*Primary Examiner* — Patricia D Valenzuela
(74) *Attorney, Agent, or Firm* — ScienBiziP, P.C.

(57) ABSTRACT

A light-emitting device includes a light-emitting layer containing: quantum dots serving as light emitters; and dummy flakes not involved in emitting light. The quantum dots are localized. Thanks to such features, light generated from the quantum dots is diffracted in the light-emitting layer, directed in a normal direction that is a thickness direction of an array substrate, and emitted out of the light-emitting device.

20 Claims, 8 Drawing Sheets

LIGHT EMITTING DEVICE AND METHOD FOR MANUFACTURING LIGHT EMITTING DEVICE

TECHNICAL FIELD

The disclosure relates to a light emitting device including a light-emitting layer, and a method for manufacturing the light emitting device.

BACKGROUND ART

Surface light-emitting elements, such as organic EL elements and inorganic EL elements including a light-emitting layer, are known in the art. Such a surface light-emitting element is required to reduce light that is totally reflected back on an interface and an outgoing plane between a transparent electrode and a glass substrate, and to increase efficiency in releasing the light.

Patent Document 1, for example, discloses a technique to increase the efficiency in releasing the light. Specifically, the technique disclosed in Patent Document 1 relates to a surface light-emitting element including an electrode patterned to have a regular structure, so that a light-emitting layer has regular refractive-index distribution to release the light more efficiently.

CITATION LIST

Patent Literature

[Patent Document 1] Japanese Unexamined Patent Application Publication No. 2007-080890 (published on Mar. 29, 2007).

SUMMARY

Technical Problems

The technique disclosed in Patent Document 1 has manufacturing problems.

Specifically, when the electrode is patterned as described in Patent Document 1, such an error as breaking the continuity of the patterning might cause a defect at least in a pixel including the electrode.

Moreover, it is difficult to pattern the electrode at narrow pitches as described in Patent Document 1. Even if the electrode is patterned to have pitches (e.g. approximately 10 µm) wider than the pitches disclosed in Patent Document 1, the patterning involves many processes. Accordingly, the production costs increase. Furthermore, the light-emitting element having an electrode with pitches of 10 µm cannot release light efficiently.

An aspect of the disclosure is intended to provide a light-emitting device that releases light more efficiently with a simple configuration.

Solution to Problems

In order to solve the above problems, an aspect of the disclosure relates to a light-emitting device including: a first electrode; a second electrode; and a light-emitting layer, all of which are provided above a substrate. The light-emitting layer includes light emitters localized and emitting light when a voltage is applied to the first electrode and the second electrode. The light-emitting layer includes: first regions; and second regions different from the first regions. The first regions and the second regions are regularly and alternately arranged in a direction perpendicular to a normal direction of the substrate. The first regions in a layer containing the light emitters have a first thickness in the normal direction of the substrate, and the second regions in the layer containing the light emitters have a second thickness thinner than the first thickness in the normal direction.

In order to solve the above problems, an aspect of the disclosure relates to another light-emitting device including: a first electrode; a second electrode; and a light-emitting layer, all of which are provided above a substrate. The light-emitting layer includes light emitters emitting light when a voltage is applied to the first electrode and the second electrode. The light-emitting layer includes: first regions in which the light emitters have a first area density; and second regions in which the light emitters have a second area density lower than the first area density. The first regions and the second regions are regularly and alternately arranged in a direction perpendicular to a normal direction of the substrate.

In order to solve the above problems, an aspect of the disclosure relates to still another light-emitting device including a plurality of pixels. Each of the pixels includes: a first electrode; a second electrode; and a light-emitting layer, all of which are provided above a substrate. The light-emitting layer includes light emitters emitting light when a voltage is applied to the first electrode and the second electrode. The light-emitting layer includes: first regions having a first luminance intensity; and second regions having a second luminance intensity lower than the first luminance intensity. The first regions and the second regions are regularly and alternately arranged in a direction perpendicular to a normal direction of the substrate.

In order to solve the above problems, an aspect of the disclosure relates to a method for manufacturing a light-emitting device including a first electrode, a second electrode, and a light-emitting layer, all of which are provided above a substrate. The light-emitting layer includes light emitters localized and emitting light when a voltage is applied to the first electrode and the second electrode. The method includes a forming step of forming the light-emitting layer. The light-emitting layer formed in the forming step includes: first regions; and second regions different from the first regions. The first regions and the second regions are regularly and alternately arranged in a direction perpendicular to a normal direction of the substrate. The first regions in a layer containing the light emitters have a first thickness in the normal direction of the substrate, and the second regions in the layer containing the light emitters have a second thickness thinner than the first thickness in the normal direction.

In order to solve the above problems, an aspect of the disclosure relates to another method for manufacturing a light-emitting device including a first electrode, a second electrode, and a light-emitting layer, all of which are provided above a substrate. The light-emitting layer includes light emitters emitting light when a voltage is applied to the first electrode and the second electrode. The method includes a forming step of forming the light-emitting layer. The light-emitting layer formed in the forming step includes: first regions in which the light emitters have a first area density; and second regions in which the light emitters have a second area density lower than the first area density. The first regions and the second regions are regularly and alternately arranged in a direction perpendicular to a normal direction of the substrate.

In order to solve the above problems, an aspect of the disclosure relates to still another method for manufacturing a light-emitting device including a plurality of pixels each including a first electrode, a second electrode, and a light-emitting layer, all of which are provided above a substrate. The light-emitting layer includes light emitters emitting light when a voltage is applied to the first electrode and the second electrode. The method includes a forming step of forming the light-emitting layer. The light-emitting layer formed in the forming step includes: first regions having a first luminance intensity; and second regions having a second luminance intensity lower than the first luminance intensity. The first regions and the second regions are regularly and alternately arranged in a direction perpendicular to a normal direction of the substrate.

Advantageous Effect of Invention

An aspect of the disclosure can provide a light-emitting device that releases light more efficiently with a simple configuration.

DESCRIPTION OF EMBODIMENTS

First Embodiment

Described below is an embodiment of the disclosure, with reference to FIGS. 1 to 7.

A light-emitting device according to an embodiment of the disclosure addresses a known issue, that is, to release light outwards more efficiently with a simple configuration. In general, the light-emitting device according to a first embodiment includes a light-emitting layer emitting light when a voltage is applied to an anode (a first electrode) and a cathode (a second electrode). The amount of light emitted from this light-emitting layer regularly varies in a direction perpendicular (normal) to a thickness direction of the light-emitting device. Such a feature allows the light-emitting layer to serve as a diffraction grading to generate diffracted light. Hence, the light emitted from the light-emitting layer travels only in the normal direction or in a substantially normal direction. Such light is not totally reflected back on a surface of the light-emitting device, but is released outwards highly efficiently.

Described below is a configuration of the light-emitting device according to this embodiment, with reference to FIGS. 1 to 7.

(I) A Configuration of the Light-Emitting Device

Figure 1:
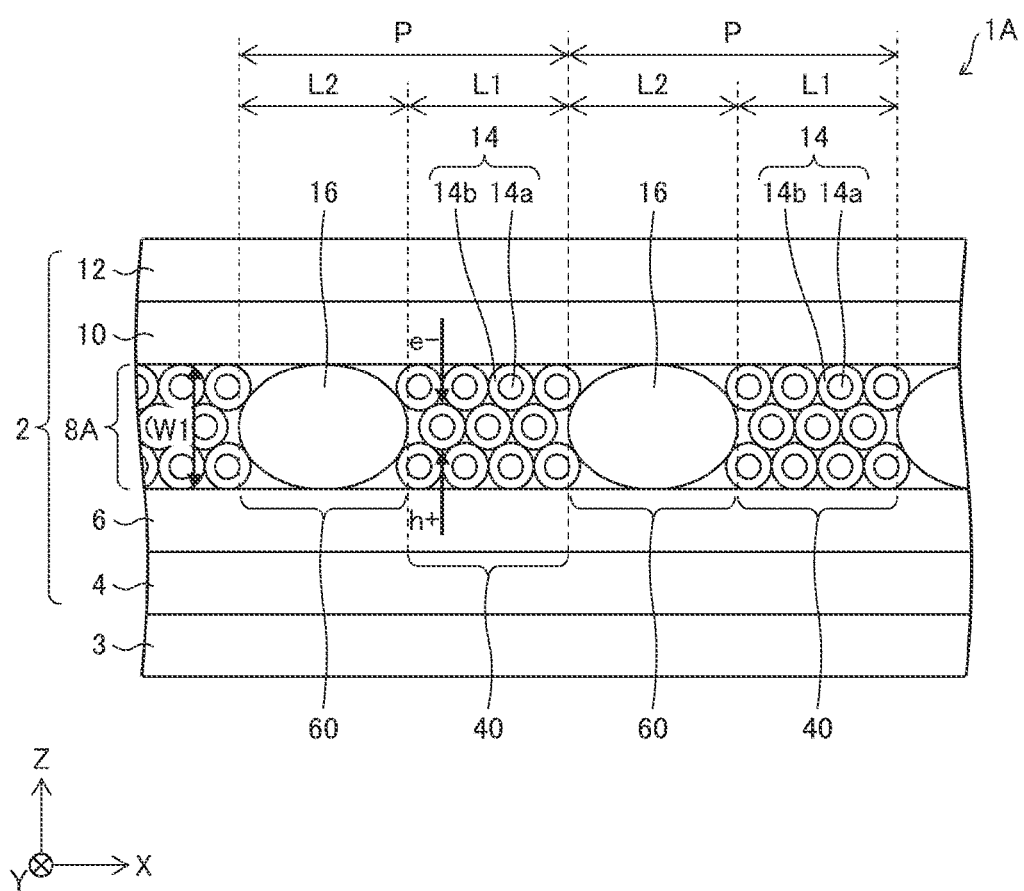
FIG. 1 is a cross-sectional view of a light-emitting device according to a first embodiment that is an embodiment of the disclosure.

FIG. 1 is a schematic cross-sectional view of a light-emitting device 1A according to this first embodiment.

As illustrated in FIG. 1, the light-emitting device 1A according to this first embodiment includes: a light-emitting element 2; and an array substrate 3 (a substrate). The light-emitting device 1A is structured to include the light-emitting element 2 multilayered and stacked on the array substrate 3 formed of not-shown thin-film transistors (TFTs). Note that, in DESCRIPTION, a direction from the light-emitting element 2 in the light-emitting device 1A toward the array substrate 3 is referred to as a "downward direction", and a direction from the array substrate 3 toward the light-emitting element 2 in the light-emitting device 1A is referred to as an "upward direction". Moreover, in FIG. 1, an XYZ-coordinate system is defined. In the XYZ-coordinate system, a Z-axis indicates the upward direction and the downward direction (the normal direction) and an XY plane indicates the planar direction of the layers lying perpendicularly to the normal direction.

The light-emitting element 2 includes: an anode 4 (a first electrode); a hole-transport layer 6; a light-emitting layer 8A; an electron-transport layer 10; and a cathode 12 (a second electrode), all of which are stacked on top of another in the stated order from below. The anode 4, which is included in the light-emitting element 2 formed above the array substrate 3, is electrically connected to the TFTs of the array substrate 3. For a light-emitting element according to another embodiment, the cathode may be provided above the array substrate. Such a light-emitting element may include: the cathode; the electron-transport layer; the light-emitting layer; the hole-transport layer; and the anode on top of another in the stated order.

Described in detail below are the layers of the light-emitting element 2.

The anode 4 and the cathode 12, containing a conductive material, are respectively and electrically connected to the hole-transport layer 6 and the electron-transport layer 10.

Either the anode 4 or the cathode 12 is a transparent electrode. The transparent electrode may be made of, for example, ITO, IZO, ZnO, AZO, BZO, or FTO, and deposited by, for example, sputtering. Moreover, either the anode 4 or the cathode 12 may contain a metallic material. The metallic material preferably includes such a substance as Al, Cu, Au, Ag, or Mg which is high in reflectance of visible light. The metallic material preferably includes either such a substance alone, or an alloy of the substances.

The hole-transport layer 6 transports holes from the anode 4 to the light-emitting layer 8A. In this embodiment, the hole-transport layer 6 may contain a material of a hole-transport layer to be typically used for a charge-injection light-emitting element. For example, in this first embodiment, the hole-transport layer 6 contains a p-type semiconductor material. In view of obtaining sufficient carrier concentration and carrier mobility, and of reducing degradation by, for example, water, the hole-transport layer 6 preferably contains an inorganic material. In this first embodiment, the hole-transport layer 6 contains such a semiconductor material as oxide. Specifically, for example, the hole-transport layer 6 contains any one of such oxides as Ni, Cu, and Cr. Alternatively, the hole-transport layer 6 contains a mixture of these oxides. In addition to these materials, the hole-transport layer 6 may additionally contain Li or La.

The electron-transport layer 10 transports electrons from the cathode 12 to the light-emitting layer 8A. In this embodiment, as seen in the hole-transport layer 6, the electron-transport layer 10 may contain a material of an electron-transport layer to be typically used for a charge-injection light-emitting element. For example, in this first embodiment, the electron-transport layer 10 contains an n-type semiconductor material. In view of obtaining sufficient carrier concentration and carrier mobility, and of reducing degradation by, for example, water, the electron-transport layer 10 preferably contains an inorganic material as the hole-transport layer 6 does. In this first embodiment, as seen in the hole-transport layer 6, the electron-transport layer 10 contains such a semiconductor material as oxide. Specifically, the electron-transport layer 10 contains any one of such chalcogenides as Zn, Ti, In, Ga, Sn, V, Mo, and W. Alternatively, the electron-transport layer 10 contains a mixture of these chalcogenides.

Note that, in this first embodiment, the materials contained in the hole-transport layer 6 and the electron-transport layer 10 may partially be oxygen-deficient. Moreover, as seen in a typical charge transport layer, the hole-transport layer 6 and the electron-transport layer 10 may contain a small amount of dopant.

The light-emitting layer 8A contains: a plurality of quantum dots 14 (semiconductor nanoparticles) serving as light emitters; and a plurality of dummy flakes 16 not involved in emitting light.

The quantum dots 14; namely, a quantum-dot (QLED) material, are semiconductor nanoparticles having a valence band level and a conduction band level. The quantum dots 14 emit light by recombination of the holes in the valence band level and the electrons in the conduction band level. Thanks to the quantum confinement effect, the light emitted from the quantum dots 14 can have a narrow spectrum.

The quantum dots 14 may be appropriately selected from materials to be used in this technical filed. Moreover, as illustrated in, for example, FIG. 1, each of the quantum dots 14 may have a core/shell structure including: a core 14$a$; and a shell 14$b$ serving as an outer shell of the core 14$a$. Note that the light-emitting layer 8A may further contain ligands coordinated to, and binding to, an outermost layer of the quantum dots 14. The quantum dots 14 to be used in this first embodiment have ligands.

Each quantum dot 14 has a particle size ranging approximately from 2 to 15 nm. A wavelength of the light emitted from the quantum dots 14 can be controlled with the particle size of the quantum dots 14. Thus, when the particle size of the quantum dots 14 is controlled, the wavelength of the light emitted from the light-emitting device 1A can be controlled.

As illustrated in FIG. 1, in the light-emitting layer 8A, the quantum dots 14 are locally arranged in an in-plane direction (a direction perpendicular to the normal direction of the array substrate 3) of the light-emitting layer 8A. In other words, as illustrated in FIG. 1, the dummy flakes 16 are locally arranged in the in-plane direction (the direction perpendicular to the normal direction of the array substrate 3) of the light-emitting layer 8A. Specifically, as will be described later, the dummy flakes 16 are arranged at predetermined pitches in the in-plane direction of the light-emitting layer. The quantum dots 14 in groups fill the spacing between the dummy flakes 16. Thanks to such a feature, quantum-dot placement regions 40 (first regions), in which the quantum dots 14 are placed in groups, are also arranged in predetermined pitches. Hence, the light can be diffracted.

That is, as illustrated in FIG. 1, the light-emitting layer 8A includes: the quantum-dot placement regions 40; and non-light-emitting regions 60 (second regions) in which the dummy flakes 16 are arranged and the quantum dots are not contained. The quantum-dot placement regions 40 and the non-light-emitting regions 60 are regularly and alternately arranged in the direction perpendicular to the Z-axis (the normal) direction. Hence, the light-emitting layer 8A diffracts and emits light.

Here, in this first embodiment, the non-light-emitting regions 60 include only the dummy flakes 16 not involved in emitting light, and thus do not emit light. However, the non-light-emitting regions 60 may be lower in luminance intensity than the light-quantum dot placement regions 40. Hence, for example, the quantum dots 14; namely, light emitters, may be contained in the non-light-emitting regions 60 together with the dummy flakes 16. Such a feature will be described later.

That is, the light-emitting layer 8A according to this first embodiment includes the quantum-dot placement regions 40 having a luminance intensity (a first luminance intensity) and the non-light-emitting regions 60 having a luminance intensity (a second luminance intensity) lower than the first luminance intensity. The quantum-dot placement regions 40 and the non-light-emitting regions 60 are regularly and alternately arranged in the direction perpendicular to the normal direction of the array substrate 3.

The light-emitting layer 8A may have a thickness ranging, for example, from 20 to 70 nm. In this first embodiment, the non-light-emitting regions 60 include the dummy flakes 16 alone as will be described later, and, in this first embodiment, the light-emitting layer 8A is as thick as the dummy flakes 16.

Described below are details of the light-emitting layer 8A.
(II) A Configuration of the Light-Emitting Layer FIG. 2 is a partial top view of a region in a portion of the XY plane of the light-emitting layer 8A.

When observed in the XY plane, the dummy flakes 16 are arranged at intervals in the XY plane. The quantum dots 14 are filled in the spacing between the dummy flakes 16 to form the quantum dot placement regions 40.

The dummy flakes 16 are insulative. For example, plate crystals of mica and barium sulfate can be used as the dummy flakes 16. Moreover, the dummy flakes 16 may be made of flat particles of silver, lead carbonate, and zinc oxide all of which are coated with $SiO_2$. A fluid disperse containing the mixture of these materials is applied and dried, and obtained are the quantum dots 14 filled between the dummy flakes 16 arranged at intervals. Here, the quantum-dot placement regions 40 are arranged in an imaginary pitch P illustrated in FIG. 2. Hence, the light can be diffracted.

Figure 2:
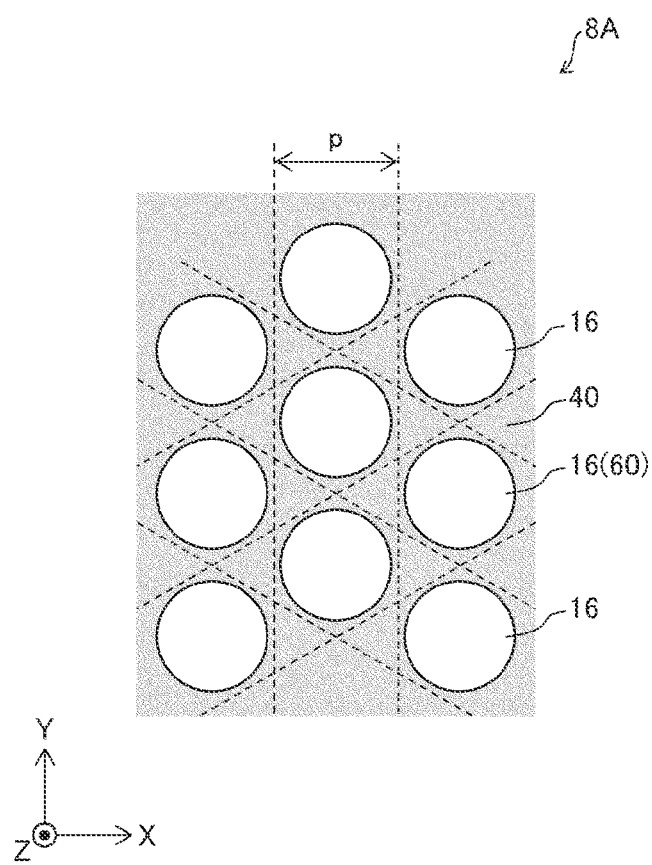
FIG. 2 is a partial top view of a region in a portion of a light-emitting layer included in the light-emitting device in FIG. 1.

Note that, in this first embodiment, as illustrated with broken lines in FIG. 2, the dummy flakes 16 form pitches in three directions. The quantum-dot placement regions 40 are arranged in accordance with the pitches in the three directions. Hence, the light can be diffracted. In other words, the light-emitting layer 8A includes the quantum dots 14 along grid lines of a hexagonal lattice in plan view. Hence, a more isotropic interference effect can be observed.

Here, the imaginary pitch P can be defined below.

Figure 3:
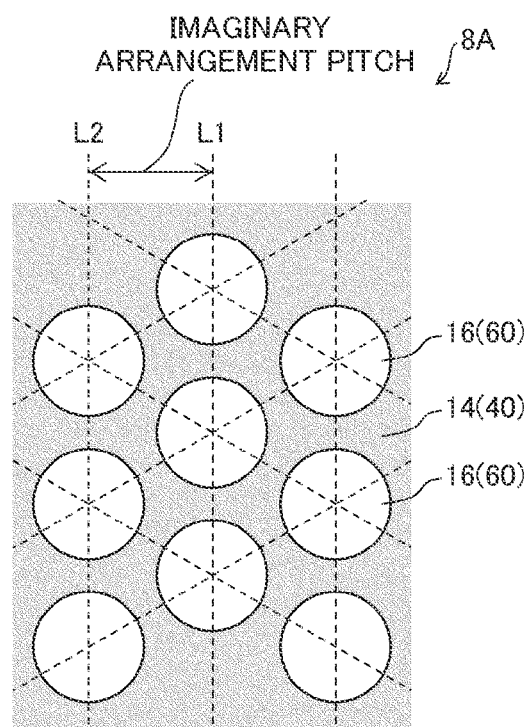
FIG. 3 is a partial top view of the light-emitting layer in FIG. 2.

FIG. 3 is a partial top view of the light-emitting layer 8A in FIG. 2. A line L1 averagely connects centers of gravity of dummy flakes 16 substantially arranged along a line connecting centers of gravity of two dummy flakes 16 closest to each other. A line L2, running in parallel with the line L1, averagely connects centers of gravity of other dummy flakes 16 arranged side by side with the dummy flakes 16. Here, when a distance between the line L1 and the line L2 is defined as an imaginary arrangement pitch, the imaginary pitch P is equal to this imaginary arrangement pitch. In this embodiment, the dummy flakes 16 are arranged symmetrically six times. That is why imaginary equal pitches appear in three directions.

The light generated from the light-emitting layer 8A is a diffracted light ray, depending on the spacing arranged in the quantum dot placement regions 40. Among diffracted light rays, the most intense light ray is a zero-order diffracted light ray traveling in the normal direction of a plane in which the light emitters are arranged. The intensity of the light rays becomes lower in the order of a first-order diffracted light ray and a second-order diffracted light ray angled with respect to the zero-order diffracted light ray. That is, the zero-order diffracted light ray can be provided with directivity to give the zero-order diffracted light ray the highest intensity with respect to the normal direction of the array substrate 3 (FIG. 1) in the light-emitting device 1A. Such a feature reduces light totally reflected and guided on, for example, the outermost surface of the light-emitting device 1A, making it possible to release the light outwards highly efficiently.

In this first embodiment, in order to keep the light from being totally reflected, and to release the light outwards more efficiently, the quantum-dot placement regions 40 (the quantum dots 14) of the light-emitting layer 8A are localized in the order of one-half of a wavelength of the emitted light (a wavelength of visible light). That is, the minimum value of the imaginary pitch P is one-half of the wavelength of the emitted light (the wavelength of visible light). Thanks to such a feature, the light-emitting device 1A of this first embodiment can release outwards light rays up to the second-order diffracted light ray generated from the light-emitting layer 8A. In using up to the second-order diffracted light ray, the same pitch as the wavelengths of RGB is the minimum value of the imaginary pitch P.

Figure 4:
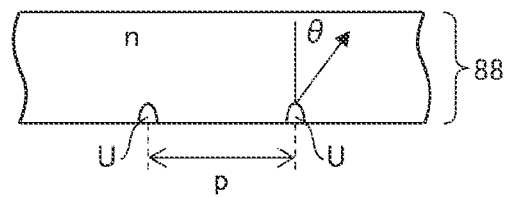
FIG. 4 is a cross-sectional view of an imaginary light-emitting layer showing an imaginary pitch of the light-emitting layer in FIG. 2.

Here, the pitch is further described in accordance with an imaginary light-emitting layer illustrated in FIG. 4. FIG. 4 is a cross-sectional view schematically illustrating a state in which light emitters U are localized at a pitch p in an imaginary light-emitting layer 88 having a refractive index n, and the light emitters U emit light. In this imaginary light-emitting layer 88, a condition to diffract the emitted light at the refractive index n is represented by an expression $p \cdot \sin \theta = m \cdot \lambda / n$, where p is a pitch, $\lambda$ is a wavelength of the light observed if the imaginary light-emitting layer 88 is of a display device, and m is a diffractive order.

If the imaginary light-emitting layer 88 has a refractive index of n=2, a total reflection angle θ is of θ=30° on the surface of the display panel, and λ for each of red (R), green (G), and blue (B) is 630 nm, 530 nm, and 450 nm, the lower limits of p to keep the first-order diffracted light ray from being totally reflected are R: 630 nm, G: 530 nm, and B: 450 nm. The lower limits of p to keep the second-order diffracted light ray from being totally reflected are R: 1,260 nm, G: 1,060 nm, and B: 900 nm.

That is, for a display having pixels of three colors R, G, B, the lower limit is p=630 nm, and, more preferably, p=1,260 nm. If the display has pixels of single color B alone, the lower limit is p=450 nm, and, more preferably p=900 nm. Moreover, if an ultraviolet ray is surface-emitted for use of, for example, a black light, the lower limit may be set to, for example, p=365 nm.

Thanks to such a feature, the ultraviolet ray can be kept from being totally reflected, and released in the normal direction as diffracted light.

Figure 5:
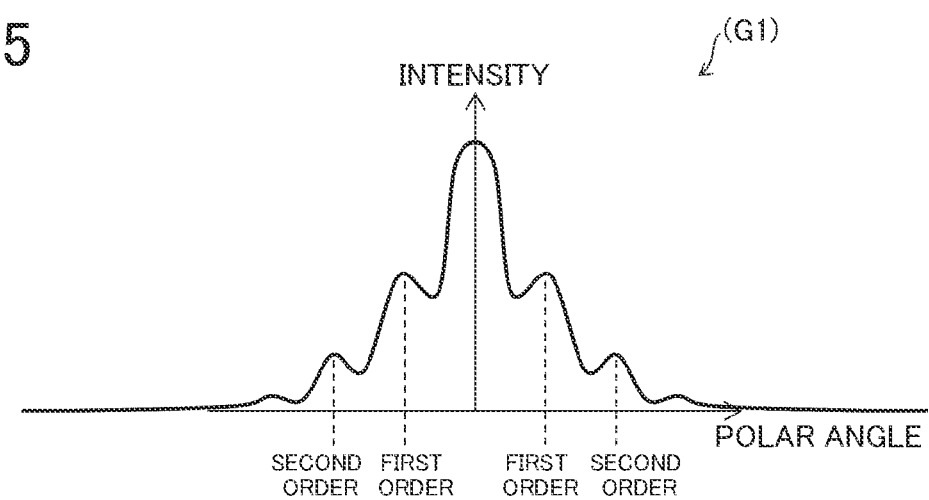
FIG. 5 shows graphs illustrating a relationship between a luminance intensity and an angle of light as to the imaginary light-emitting layer in FIG. 4.
Figure 5:
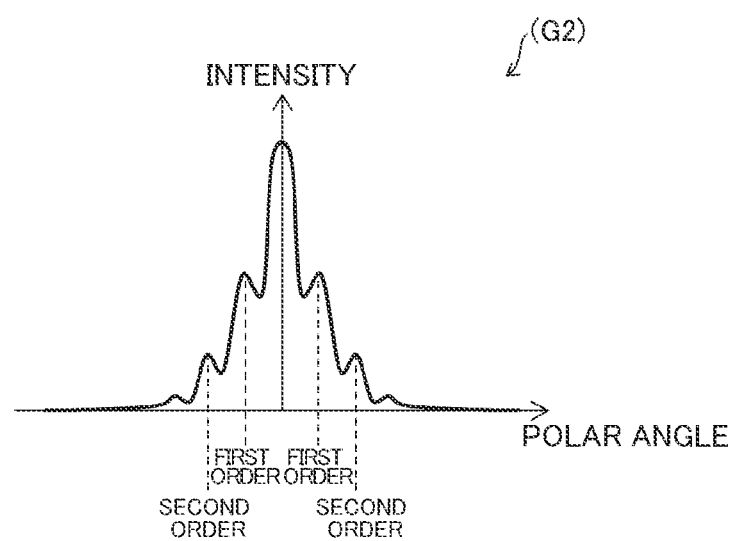

FIG. 5 shows graphs illustrating a relationship between a luminance intensity and an angle of light, as to the imaginary light-emitting layer 88 in FIG. 4, in a case where the pitch p between the light emitters U is either relatively wide or relatively narrow. An upper graph (G1) in FIG. 5 shows the case where the pitch p between the light emitters U is relatively narrow. A lower graph (G2) in FIG. 5 shows the case where the pitch p between the light emitters U is relatively wide. Both cases are compared. Compared with the case where the pitch p is relatively narrow (G1), the case where the pitch p is relatively wide (G2) shows that the angle with respect to the zero-order diffracted light ray is smaller than the angels with respect to both of the first-order diffracted light ray and the second-order diffracted light ray. That is, when the pitch p is wide, it can be said that the generated diffracted light is highly directive in the normal direction.

However, even if the light is released outwards more efficiently, the high directivity in the panel normal direction is not preferable in many cases. Hence, if the second-order diffracted light ray is emitted from the panel at an angle of, for example, approximately 20° or greater, the pitch p preferably has an upper limit of 3,000 nm. Note that, for a use that requires a limitation on a viewing angle, the directivity would be required. Hence, the upper limit is not an exact value.

Note that the structure and regularity of the regular structure to be formed varies, and the wavelengths and the phases of the light to be emitted are not completely coherent. Hence, the diffracted light has a wide angle of diffraction. Hence, the calculated angle is not an exact angle. If the light is to be at least diffracted, the light can be angled in the panel normal direction in which the zero-order diffracted light ray travels.

Hence, if the pitch p is one-half of λ/n or wider; that is, a condition in which the light can be diffracted, an interference effect can be observed in the light-emitting layer.

The above features apply to the imaginary pitch P illustrated in FIG. 2. Numerically, the imaginary pitch P ranges from 190 to 5,000 nm. Thanks to such a feature, the interference effect can be certainly observed in the light-emitting layer 8A, and the display device can have a sufficient viewing angle. As to a display that presents images typically in three primary colors of R, G, and B, the light rays in each of the colors should be obtained equally efficiently. Preferably, the imaginary pitch P ranges from 1,260 to 3,000 nm.

Alternatively, for example, a near-ultraviolet light ray of approximately 380 nm is emitted, and a quantum-dot (QD) layer for converting wavelength may be provided to a face toward which the light is released. In the case where light rays of R, G, and B are released, the QD layers to be used are: a red QD layer converting the near-ultraviolet light ray into a light ray R; a green QD layer converting the near-ultraviolet light ray into a light ray G; and a blue QD layer converting the near-ultraviolet light ray into a light ray B.

An example of a dummy flake 16 may be, but not limited to, a flake having a length along the normal line (a thickness) of 30 nm and a size of 1,300 nm. Moreover, in order to reduce the directivity of the light, the size is preferably 600 nm or smaller.

The technique to form the imaginary pitch P as described above will be detailed in a manufacturing technique to be described later. The imaginary pitch P can be formed by a simple technique: that is, applying a fluid disperse in which the quantum dots 14 and the dummy flakes 16 are dispersed, and drying the applied fluid disperse.

Described below are advantageous effects to be obtained from the above light-emitting layer 8A, with reference to FIG. 6. In describing the advantageous effects, FIG. 7 shows a schematic configuration of a known light-emitting layer in which generated light is not diffracted, and dependence of luminance intensity on an angle observed of the known light-emitting layer.

Figure 6:
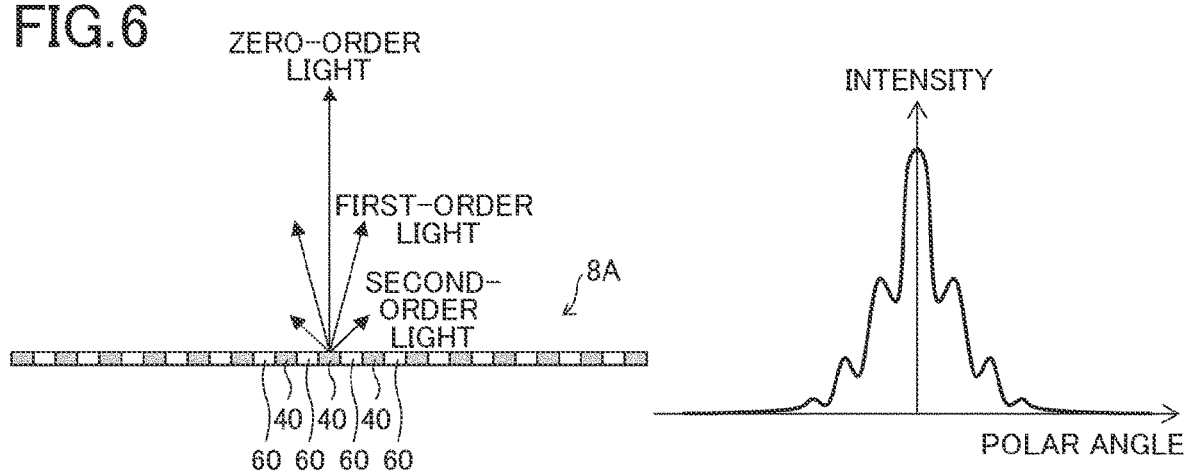
FIG. 6 shows an advantageous effect of the light-emitting layer included in the light-emitting device in FIG. 1.
Figure 7:
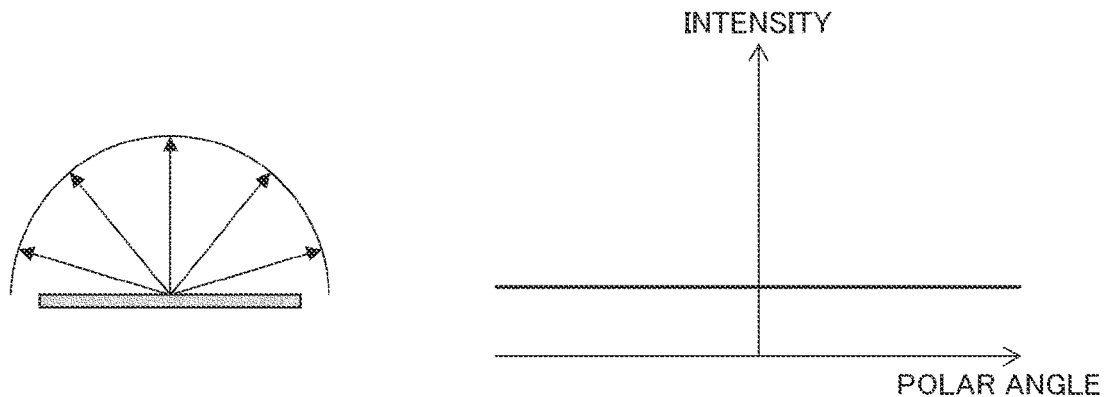
FIG. 7 illustrates a comparative configuration.

In FIG. 6, the light-emitting layer 8A according to this first embodiment is schematically illustrated on the left. In the light-emitting layer 8A, the quantum-dot placement regions 40 are localized. Schematically illustrated in FIG. 6 are diffracted light rays generated from one of the arranged quantum-dot placement regions 40. Because of the localized quantum-dot placement regions 40 as illustrated in FIG. 6, the generated light rays are diffracted. The diffracted light rays are directive, such that the most intense light ray is the zero-order diffracted light ray in the thickness direction (the normal direction) of the light-emitting layer. Such a feature is also illustrated in the graph in FIG. 6 on the right. The graph shows a relationship between luminance intensity and polar angle. As seen in the graph, the most intense light ray is the zero-order diffracted light ray. The intensity of light rays becomes lower in the order of the first-order diffracted light ray and the second-order diffracted light ray angled with respect to the zero-order diffracted light ray. The light rays angled greater than, or equal to, the third-order diffracted light ray are very weak. Such features keep the light from being totally reflected, making it possible to release the light outwards highly effectively. In contrast, in the light-emitting layer of the comparative configuration, the light-emitting regions are not localized unlike the light-emitting layer 8A in this first embodiment. As schematically illustrated in FIG. 7 on the left, the light is isotropically emitted. Hence, as illustrated in the graph in FIG. 7 on the right, which shows a relationship between luminance intensity and polar angle, the light rays generated from the light-emitting layer are not diffracted. The light rays at various angles are generated to have substantially the same luminance intensity. Hence, light rays at wide angles are totally reflected on the surface of the light-emitting device, and only some of the light rays are released outwards.

As can be seen, this first embodiment can provide a light-emitting device to generate diffracted light by the light-emitting layer 8A with a simple configuration, and to release the diffracted light highly efficiently.

Here, for efficient diffraction of light, the light is beneficially high in coherence. Compared with a white light source, an organic EL display emits light distributed around a certain energy level; that is, light close to a single wavelength. That is why the light from the organic EL display is high in coherence. However, if quantum dots are used as light emitters, the obtained light is higher in coherence. The display using such light emitters is likely to exhibit advantageous effects of the diffraction. However, the phases of the emitted light varies and the light emitters are not arranged at constant pitches. Hence, the light is actually emitted in all direction; that is, substantially in the normal direction of the zero-order diffracted light. Moreover, the emitted light is refracted on the surface of the substrate to spread toward wider angles. Hence, the display can obtain a bright image with a wider viewing angle.

(III) A Method for Manufacturing a Light-Emitting Device

Described here is a method for manufacturing a light-emitting device according to this first embodiment illustrated in FIG. 1. Note that described below is a case where the layers of the light-emitting element 2 are sequentially stacked from below upward on the array substrate 3 that is the lowermost layer of the light-emitting device 1A in FIG. 1.

First, the method includes an anode forming step of forming the anode 4 on the array substrate 3. Next, the method includes a hole-transport-layer forming step of forming the hole-transport layer 6 on the formed anode 4. Next, the method includes a light-emitting-layer forming step (a forming step) of forming the light-emitting layer 8A on the formed hole-transport layer 6. Next, the method includes an electron-transport-layer forming step of forming the electron-transport layer 10 on the formed light-emitting layer 8A. Next, the method includes a cathode forming step of forming the cathode 12 on the formed electron-transport layer 10.

Through the above steps, the light-emitting device 1A is manufactured. The forming steps except the light-emitting-layer forming step can be carried out by known techniques, and will not be elaborated upon here.

(IV) The Light-Emitting-Layer Forming Step

The light-emitting-layer forming step involves forming the light-emitting layer 8A. In the light-emitting layer 8A, the quantum-dot placement regions 40 have a luminance intensity (a first luminance intensity) and the non-light-emitting regions 60 have a luminance intensity (a second luminance intensity) lower than the first luminance intensity. The quantum-dot placement regions 40 and the non-light-emitting regions 60 are regularly and alternately arranged in the direction perpendicular to the normal direction of the array substrate 3.

Specifically, the light-emitting-layer forming step includes: a preparing step of preparing a mixed fluid disperse in which the quantum dots 14 and the dummy flakes 16 are dispersed; an applying step of applying the prepared mixed fluid disperse to the hole-transport layer 6; and a drying step of drying the applied mixed fluid disperse.

The mixed fluid disperse can be made of: a solvent such as hexane or toluene; and the quantum dots 14 and the dummy flakes 16 to be dispersed in the solvent. Mixed with the fluid disperse may be such a dispersant as thiol and amine.

Moreover, the mixed fluid disperse may be applied by such a technique as spin coating or ink-jet printing.

While the mixed fluid disperse applied on the hole-transport layer 6 dries, the quantum dots 14 are filled in the spacing between the dummy flakes 16 arranged at intervals. Because of zeta potential of the dummy flakes 16, the dummy flakes 16 repel one another to be arranged as illustrated in FIGS. 1 and 2.

Here, the zeta potential of the dummy flakes 16 is preferably the same in polarity as the zeta potential of the quantum dots 14. This is because if the dummy flakes 16 and the quantum dots 14 are different in zeta potential, the quantum dots 14, for example, disperse to coat the dummy flakes 16, such that the configurations in FIGS. 1 and 2 are less likely to be obtained.

The light-emitting layer 8A formed through the above steps includes, as seen above, the quantum-dot placement regions 40 and the non-light-emitting regions 60 having a luminance intensity (the second luminance intensity) lower than the luminance intensity of the quantum-dot placement regions 40. The quantum-dot placement regions 40 and the non-light-emitting regions 60 are regularly and alternately arranged in the direction perpendicular to the normal direction of the array substrate 3. Such features reduce light totally reflected and guided on, for example, the outermost surface of the light-emitting device 1A, making it possible to release the light outwards highly efficiently.

(V) Advantageous Effects of the Light-Emitting Layer.

In the light-emitting layer 8A of this first embodiment, light-emitting regions (the quantum-dot placement regions 40) and the non-light-emitting regions 60 are regularly and alternately arranged in the direction perpendicular to the normal direction of the array substrate 3. Thanks to such a feature, the light-emitting layer emits diffracted light, reducing the risk that the light is totally reflected. Hence, a lot of light is released outwards.

As described above, in an aspect of the disclosure, the non-light-emitting regions 60 may emit light as long as the amount of the light emitted from the non-light-emitting regions 60 is smaller than the amount of the light emitted from the quantum-dot placement regions 40. In other words, if the quantum-dot placement regions 40 and the non-light-emitting regions 60 have relatively different luminance intensities, the light is diffracted and the above advantageous effects can be achieved.

Here, in DESCRIPTION, the statement "regularly and alternately arranged" means that, as an example of regions having a relatively high luminance intensity (the quantum-dot-placement regions 40) and regions having a low luminance intensity (the non-light-emitting regions 60), if the high-luminance-intensity regions and the low-luminance-intensity regions are alternately arranged at least twice, the regions are regularly arranged. That is, the arrangement may include the regions in the order of: a high-luminance-intensity region; a low-luminance-intensity region; a high-luminance-intensity region; and a low-luminance-intensity region.

In relation to the case where the high directivity appearing in the panel normal direction is not preferable when it comes to the above described display, the regular and alternate arrangement does not have to be completely the same regular and alternate arrangement. For example, the quantum-dot-placement regions 40 and the non-light-emitting regions 60 do not have to alternate with a width of 2,000 nm.

That is, both widths L1 of the quantum-dot-placement regions 40 and widths L2 of the non-light-emitting regions 60 do not always have to be alternately arranged with 2,000 nm. It can be said that the widths L1 and the widths L2 are regularly and alternately arranged on average as long as the widths L1 and the widths L2 are within a certain range such as, for example, a quantum-dot-placement region 40 having a width of 2,000 nm, a non-light-emitting region 60 having a width of 2,500 nm, a quantum-dot-placement region 40 having a width of 3,000 nm, and a non-light-emitting region 60 having a width of 2,000 nm. Moreover, for a display, such an incompletely regular arrangement is rather preferable.

The light-emitting layer 8A according to this first embodiment can be defined from a viewpoint below. Specifically, the light-emitting layer 8A can be defined only in view of a thickness of a portion (a light-emitting portion) included in the light-emitting layer 8A and containing quantum dots. The thickness here is a thickness in the normal direction of the array substrate 3. In view of this thickness, in FIG. 1, it can be said that the light-emitting layer 8A includes: the quantum-dot placement regions 40 containing the quantum dots up to the total thickness of the light-emitting layer 8A; and the non-light-emitting regions 60 containing not the quantum dots but the dummy flakes 16. The quantum-dot placement regions 40 and the non-light-emitting regions 60 are regularly and alternately arranged in a direction perpendicular to the normal direction of the array substrate 3.

In other words, in FIG. 1, it can be said that, in a layer containing the quantum dots 14, the light-emitting layer 8A includes: first regions having a first thickness W1 and included in the quantum-dot placement regions 40; and second regions having a second thickness W2 thinner than the first thickness W1 (i.e. the second thickness is zero since no quantum dots are contained) and included the non-light-emitting regions 60. Moreover, the light-emitting layer 8A includes the first regions and the second regions regularly and alternately arranged in the direction perpendicular to the normal direction of the array substrate 3.

Note that the statement regularly and alternately arranged is not only limited to the case of completely the same regularity. The statement also includes a case of a regular and alternate arrangement on average.

Furthermore, when specified from another view point, it can be said that the light-emitting layer 8A includes: the first regions (the quantum-dot placement regions 40 having the width L1) in which light emitters (the quantum dots 14) have a first area density; and the second regions (the non-light-emitting regions 60 having the width L2) in which light emitters (the quantum dots 14) have a second area density lower than the first area density. The first regions and the second regions are regularly and alternately arranged in the direction perpendicular to the normal direction of the array substrate 3. Here, the area density (the second area density) of the second regions (the non-light-emitting regions 60) may be zero. In the first embodiment, the second regions have an area density of zero. Note that, an aspect of the disclosure includes a case where the second area density is not zero. Such an aspect will be described later. Note that, also here, the statement regularly and alternately arranged is not only limited to the case of completely the same regularity. The statement also includes a case of a regular and alternate arrangement on average.

Modification 1

In this first embodiment according to the disclosure, the light emitters are, but not limited to, the quantum dots 14. For example, the light emitters may be either an organic fluorescent material or an organic phosphorescent material.

Thus, organic EL diodes (OLEDs) can be the light emitters. The OLED light-emitting layer can also be manufactured by the same technique described above. If the light-emitting layer is manufactured by such techniques as printing with a printing plate and printing without a printing plate, the light-emitting layer can be produced of ink including: such a solvent as an aromatic-based solvent or an alcoholic-based solvent; and an organic fluorescent material or an organic phosphorescent material contained in the solvent together with the dummy flakes as described above. Alternatively, the light-emitting layer can be formed by lift-off processing that involves: patterning the regular structure with a photoresist; depositing an organic fluorescent material or an organic phosphorescent material of low molecular on the substrate by vapor deposition; removing the photoresist; and obtaining a patterned organic fluorescent material or phosphorescent material.

As seen in the first embodiment, also in this Example, the light emitted from the light-emitting layer 8A is diffracted and directed in the normal direction. Hence, the light-emitting device in Modification 1 can keep the light from being totally reflected, and release the light outwards highly effectively.

Modification 2

In the first embodiment above, the light-emitting layer 8A includes the non-light-emitting regions 60 using the dummy flakes 16 shaped circularly in the plane direction (the XY plane direction) of the layer. However, an aspect of the disclosure shall not be limited to such non-light-emitting regions 60.

Figure 8:
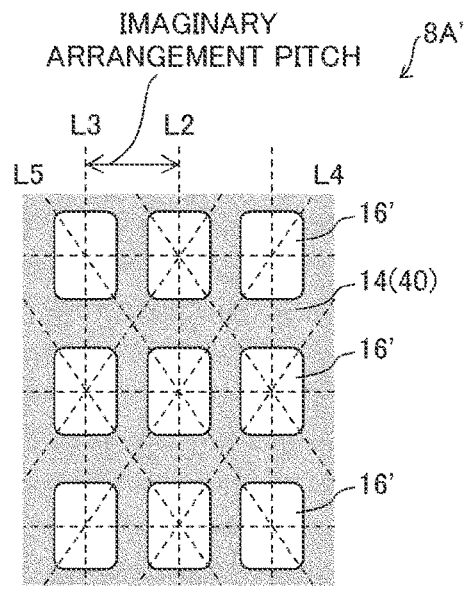
FIG. 8 is a top view of dummy flakes included in a light-emitting layer that is a modification according to an embodiment of the disclosure.

For example, FIG. 8 is a top view of dummy flakes 16' included in a light-emitting layer 8A' of this Modification 2 and observed from the XY plane. In this Modification 2, each non-light-emitting region 60 is formed of a dummy flake 16' substantially rectangular in the top view.

As illustrated in FIG. 8, when the centers of gravity of the dummy flakes 16' are arranged substantially on the vertices of the rectangles, the imaginary arrangement pitches and the imaginary pitches are formed in four directions. The above line L1 may be such lines as lines L4 and L5 not connecting two dummy flakes 16' closest to each other.

In other words, the light-emitting layer 8A' according to this Modification 2 contains the quantum dots 14 along grid lines of a rectangular lattice in plan view. Thanks to such a feature, a plurality of pitches are obtained, making it possible to release light outwards more effectively and reduce variation in luminance because of viewing angle.

Note that the shape of the dummy flakes may be any given polygonal shape such as a square shape.

The imaginary arrangement pitches may be set on the basis of the shape of a material to be used as the dummy flakes.

Second Embodiment

Another embodiment according to the disclosure will be described, with reference to FIGS. 9 and 10. Note that, for the sake of description, identical reference numerals are used to denote components having identical functions between the first and second embodiments. Such components will not be elaborated upon here.

Figure 9:
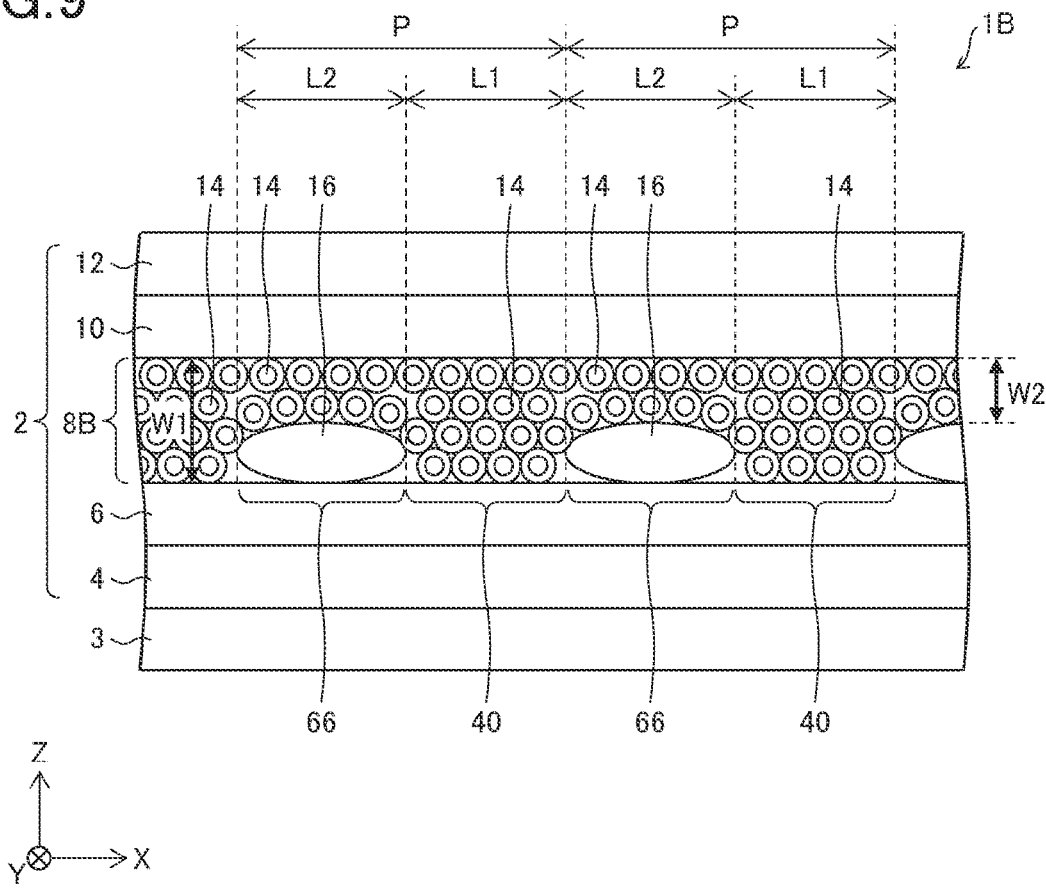
FIG. 9 is a cross-sectional view of a light-emitting device according to a second embodiment that is another embodiment of the disclosure.

FIG. 9 is a schematic cross-sectional view of a light-emitting device 1B according to this second embodiment.

A difference between the above first embodiment and this second embodiment is a configuration of the light-emitting layer. The other configurations are the same as those of the light-emitting device 1A according to the first embodiment, and will be omitted.

The difference between this second embodiment and the first embodiment is that the light-emitting device 1B of the second embodiment includes low-light-emitting regions 66 instead of the non-light-emitting regions 60 of the light-emitting layer 8A according to the first embodiment.

Specifically, the low-light-emitting regions 66 of the light-emitting layer 8B form a layer containing quantum dots 14 above the dummy flakes 16. That is, the layer containing quantum dots 14 is provided between the dummy flakes 16 and the electron-transport layer 10 stacked on the light-emitting layer 8B. In this aspect, the dummy flakes 16 are smaller in size (in thickness) than the dummy flakes 16 used in the first embodiment.

Further described below is the light-emitting layer 8B, with reference to FIG. 10.

Figure 10:
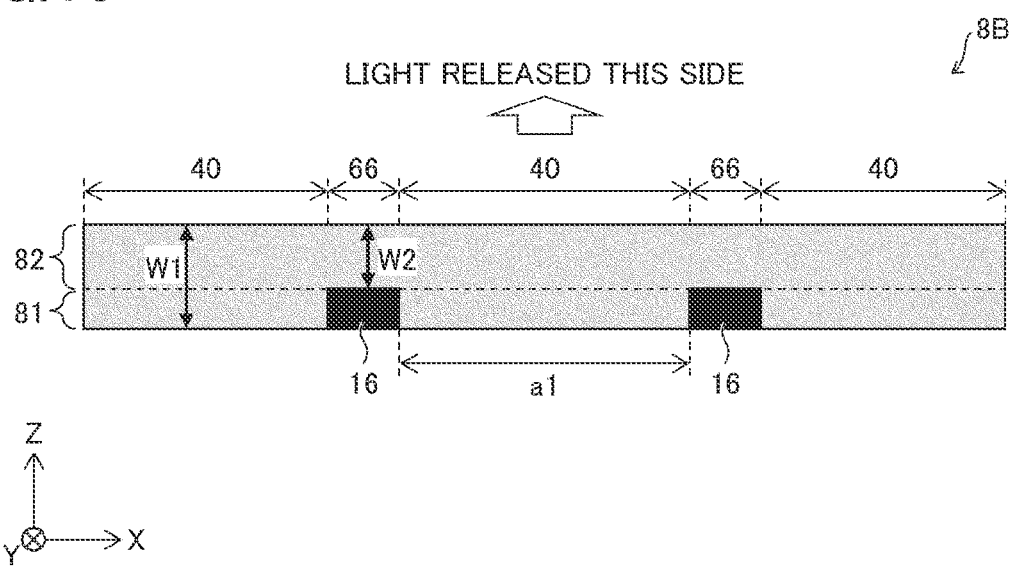
FIG. 10 is a cross-sectional view of a light-emitting layer included in the light-emitting device in FIG. 9.

FIG. 10 is a schematically cross-sectional view of the light-emitting layer 8B alone in this second embodiment.

The light-emitting layer 8B can be divided into two regions; namely, a region 81 and a region 82 in the normal direction (in the Z-axis direction). As seen in the light-emitting layer 8A of the first embodiment, the region 81 facing downwards (toward the hole-transport layer 6) includes the quantum dots 14 and the dummy flakes 16 regularly and alternately arranged in a direction perpendicular to the normal direction. That is, in the region 81, the quantum dots 14 are localized. Hence, the light generated in the region 81 is a diffracted light component. The distribution of angles in the intensity of diffracted light rays depends strictly on: widths al of the quantum-dot-placement regions 40; and the imaginary pitches P based on the dummy flakes 16 and an arrangement condition of the dummy flakes 16. The diffracted light rays are directive in the normal direction.

Meanwhile, the region 82 facing upwards (toward the electron-transport layer 10) is filled uniformly with the quantum dots 14 in a direction perpendicular to the normal direction. Hence, the light generated in the region 81 facing upwards is emitted isotropically.

Thus, the light generated from the light-emitting layer 8B includes light lays isotropic in the diffracted light and overlapping one another. Hence, the generated light is low in directivity. In the case of this second embodiment, the region 81 facing downwards is as thick as the dummy flakes 16. The thickness of the region 82 facing upwards can be appropriately set to obtain a desired luminance intensity. The dummy flakes 16 of the second embodiment are relatively smaller than those of the first embodiment. That is why the quantum dots 14 can be placed on the dummy flakes 16. Hence, the light emitted from the light-emitting layer is lower in directivity in the second embodiment than in the first embodiment. That is, the degree of the directivity of the emitted light can be adjusted, depending on the size of the dummy flakes.

Here, in view of the low-light-emitting regions 66 alone, the region 81 toward the hole-transport layer 6 is the non-light-emitting region and the region 82 toward the electron-transport layer 10 is the light-emitting region. Hence, the low-light-emitting regions 66 are lower in luminance intensity than the quantum-dot-placement regions 40 as thick as the light-emitting layer 8B.

That is, in FIG. 9, the light-emitting layer 8B includes, along the thickness: the quantum-dot-placement regions 40 filled with the quantum dots 14 up to the total thickness of the quantum-dot-placement regions 40; and the low-lightemitting regions 66 in which the dummy flakes 16 and the quantum dots 14 overlap each other. Here, in FIG. 9, it can be said that the light-emitting layer 8B includes: the quantum-dot-placement regions 40; and the low-light-emitting regions 66 arranged regularly and alternately in the direction perpendicular to the normal direction of the array substrate 3.

In other words, in the layer containing the quantum dots 14, the light-emitting layer 8B includes: the first regions having the first thickness W1 and included in the quantum-dot placement regions 40; and the second regions having the second thickness W2 thinner than the first thickness W1 and included in the low-light-emitting regions 66. Moreover, the light-emitting layer 8B includes: the first regions and the second regions arranged regularly and alternately in the direction perpendicular to the normal direction of the array substrate 3.

Note that the statement regularly and alternately arranged is not only limited to the case of completely the same regularity. The statement also includes a case of a regular and alternate arrangement on average.

Furthermore, in other words, it can be said that the light-emitting layer 8B includes: the first regions (the quantum-dot placement regions 40 having the width L1) in which light emitters (the quantum dots 14) have a first area density; and the second regions (the low-light-emitting regions 66 having the width L2) in which light emitters (the quantum dots 14) have a second area density lower than the first area density. The first regions and the second regions are regularly and alternately arranged in the direction perpendicular to the normal direction of the array substrate 3. In this second embodiment, in other words, the area density denotes the quantity of the quantum dots contained up to the total thickness of a layer (the light-emitting layer) per unit area in plan view.

In the light-emitting layer 8B according to this second embodiment, the region 81 in FIG. 9 is formed by the technique for producing the light-emitting layer 8A described in the first embodiment. Then, applied on the formed region 81 is a fluid disperse in which the quantum dots 14 are dispersed. The applied fluid disperse is dried to form the region 82 in FIG. 10. Alternatively, the light-emitting layer 8B may be formed of a fluid disperse lower in concentration of the dummy flakes than the fluid disperse of the first embodiment.

The light-emitting device 1B according to this second embodiment can release the light outwards highly effectively at high luminance.

Third Embodiment

Described below is still another embodiment of the disclosure, with reference to FIG. 11. Note that, for the sake of description, identical reference numerals are used to denote components having identical functions between this embodiment and the first and second embodiments. Such components will not be elaborated upon here.

Figure 11:
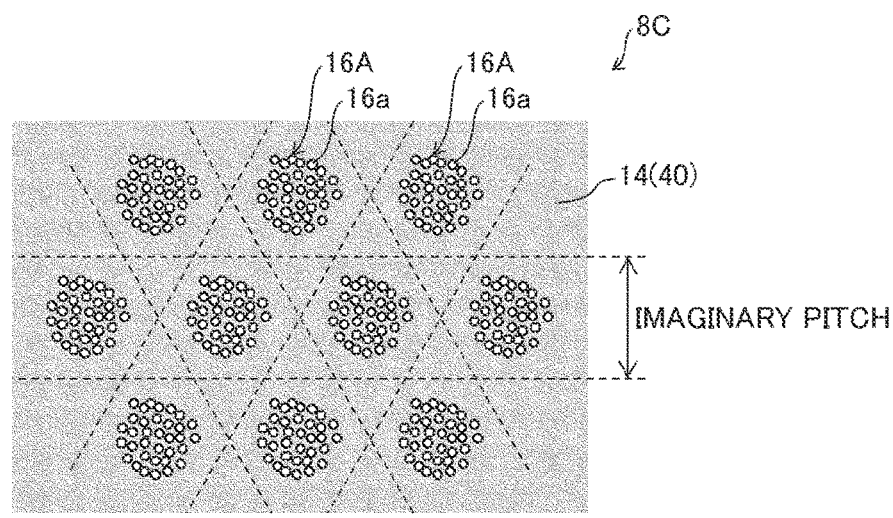
FIG. 11 is a partial top view of a light-emitting layer included in a light-emitting device according to a third embodiment that is still another embodiment of the disclosure.
Figure 11:
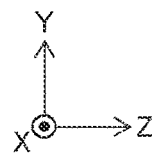

FIG. 11 is a partial top view of a light-emitting layer 8C included in a light-emitting device 1C according to this third embodiment.

In the light-emitting layer 8A according to the above first embodiment, the dummy flakes 16 are spaced at equal intervals so that the quantum dots 14 are localized. In contrast, in this third embodiment, primary agglomerates 16A of silica nanoparticles 16a (nanoparticles) themselves are arranged, instead of the dummy flakes 16 according to the first embodiment. Hence, the quantum dots 14 are localized.

A technique for producing the light-emitting layer 8C involves mixing the silica nanoparticles 16a with a fluid disperse in which the quantum dots 14 are dispersed. The silica nanoparticles 16a are surface-modified to form the primary agglomerates in a predetermined average size. Such a fluid disperse mixture is applied and dried, making it possible to obtain the light-emitting layer 8C in which the primary agglomerates 16A are substantially arranged.

One primary agglomerate 16A can be seen as one dummy flake 16 according to the above first embodiment. The primary agglomerates 16A have a size of 200 nm or larger, and, more preferably, of 330 nm or larger. Moreover, in order to reduce directivity of light, the primary agglomerates 16A have a size of 600 nm or smaller. Through a change in a selected kind and a concentration of a material to be surface-modified, the size of the primary agglomerates 16A can be adjusted to have a desired size.

Here, some of the formed primary agglomerates 16A might contain quantum dots 14 during the agglomeration. However, the amount of the quantum dots 14 contained in the primary agglomerates 16A is smaller than the amount of the quantum dots 14 contained in the quantum-dot-placement regions 40 provided between the primary agglomerates 16A. Hence, light emitted from the quantum dots 14 in the primary agglomerates 16A is weak. That is why the quantum-dot-placement regions 40 provided in the light-emitting layer 8C are arranged at the imaginary pitches p, making it possible to diffract generated light.

In forming the light-emitting layer 8C, the zeta potential of the primary agglomerates 16A is preferably the same in polarity as the zeta potential of the quantum dots 14. Such a feature can prevent the quantum dots from coating the primary agglomerates 16A and from interfering formation of imaginary pitches.

As to the primary agglomerates 16A to be used, the particle size of silica nanoparticles 16a can be as large as the thickness of the light-emitting layer 8C. However, it is not preferable that the dried agglomerates are deposited as thick as, or thicker than, the light-emitting layer 8C. In order to prevent such deposition, a technique to be used is to adjust the drying speed, depending on how firmly the silica nanoparticles 16a agglomerate.

Note that, as to the agglomerates described in this third embodiment to localize the quantum-dot-placement regions 40, the nanoparticles forming the agglomerates may emit light.

Fourth Embodiment

Described below is still another embodiment of the disclosure, with reference to FIG. 12. Note that, for the sake of description, identical reference numerals are used to denote components having identical functions between this embodiment and the above embodiments. Such components will not be elaborated upon here.

Figure 12:
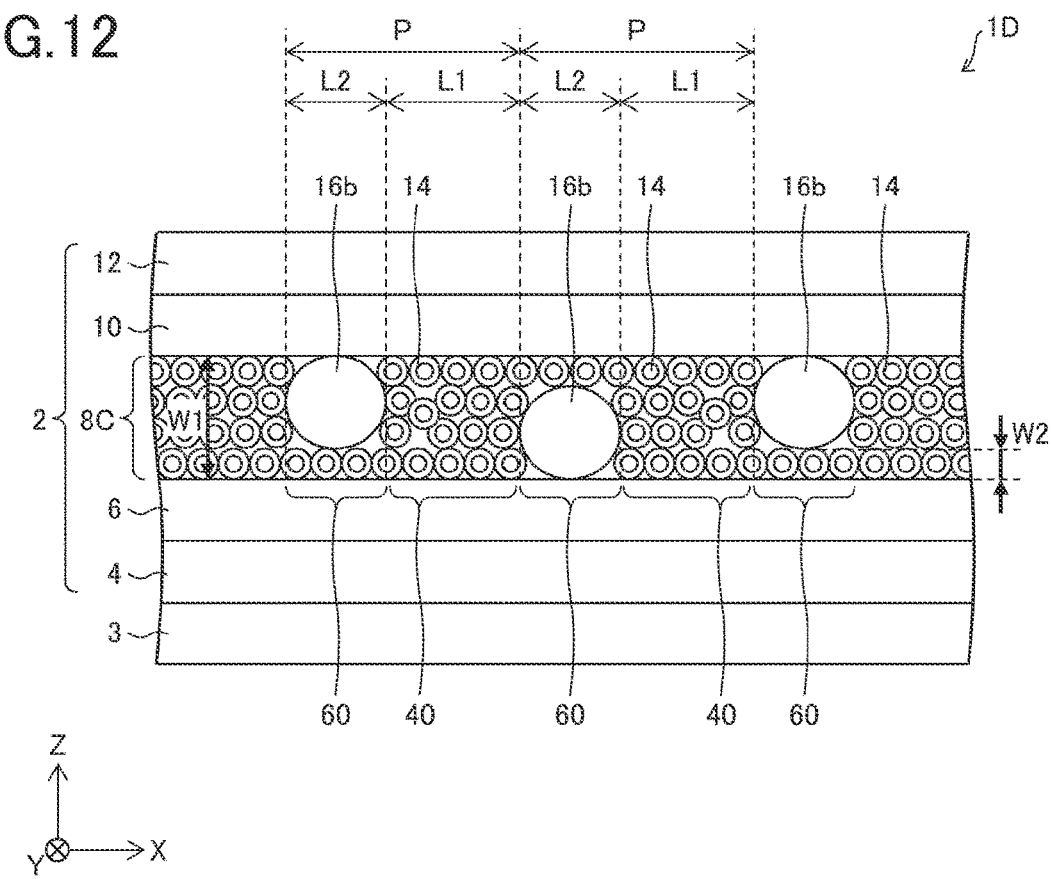
FIG. 12 is a cross-sectional view of a light-emitting device according to a fourth embodiment that is still another embodiment of the disclosure.

FIG. 12 is a schematic cross-sectional view of a light-emitting device 1D according to a fourth embodiment.

The difference between this fourth embodiment and the above first embodiment is a material of the non-light-emitting regions 60.

Specifically, in the light-emitting layer 8C of the light-emitting device 1D according to this fourth embodiment, the non-light-emitting regions 60 are formed of dummy silica nanoparticles 16b (nanoparticles, semiconductor nanoparticles).

The quantum dots 14 have a core/shell structure, and the surface of the quantum dots 14 has ligands. Such quantum dots 14 are dispersed in a solvent of, for example, octane having a concentration of 5 mg/mL. Hence, a fluid disperse is prepared. After that, dispersed into this fluid disperse are silica nanoparticles (the dummy silica nanoparticles) whose particle size is substantially as large as the thickness of the light-emitting layer 8C. For example, 1 to 10 mg of the silica nanoparticles are dispersed in the fluid disperse of 1 mL. This fluid disperse mixture is applied to, and dried on, the hole-transport layer 6. The silica nanoparticles are arranged by self-organization at equal intervals. Such a feature allows the quantum-dot-placement regions 40 to be arranged regularly.

Here, in FIG. 12, there is no region in which no quantum dot 14 is found in a plane direction. However, the silica nanoparticles 16b occupy most of the non-light-emitting regions 60 along the thickness. The amount of the quantum dots 14 found in the non-light-emitting regions 60 is very small. Hence, the luminance intensity shows regularity in the plane direction, and the light is diffracted. Moreover, when the quantum dots are used as light emitters as seen in this fourth embodiment, if the quantum dots 14 have a size of, for example, 10 nm, the quantum dots 14 rarely enter the spacing in the non-light-emitting regions 60 in the thickness direction of the silica nanoparticles 16b. Such a feature makes it possible to regularly form regions that rarely emit light.

Fifth Embodiment

In the above first and second embodiments, the dummy flakes 16 are arranged in the light-emitting layer, so that the quantum-dot-placement regions 40 are regularly arranged. Moreover, in the above third and fourth embodiments, the nanoparticles are arranged in the light-emitting layer, so that the quantum-dot-placement regions 40 are regularly arranged.

However, the arrangement of the quantum-dot-placement regions 40 shall not be limited to the above arrangements. For example, the quantum dots as light emitters are agglomerated using neither the dummy flakes nor nanoparticles, so that the luminance intensity of the light-emitting layer can be varied with regularity.

Figure 13:
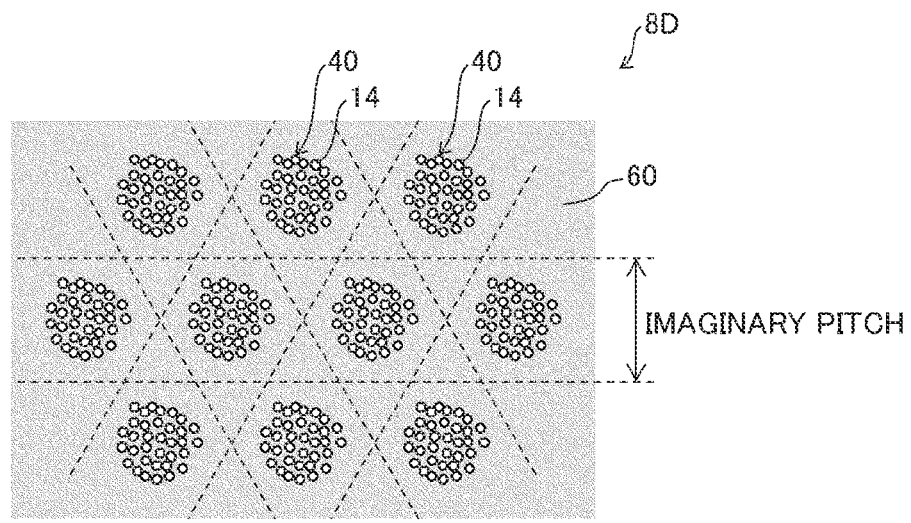
FIG. 13 is a top view of a light-emitting layer included in a light-emitting device according to a fifth embodiment that is still another embodiment of the disclosure.
Figure 13:
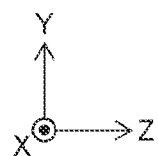

FIG. 13 is a partial top view of a light-emitting layer 8D alone in a light-emitting device according to a fifth embodiment. In the light-emitting layer 8D in FIG. 13, the quantum-dot-placement regions 40; that is, agglomerates of the quantum dots 14, are arranged. Hence, the quantum-dot-placement regions 40 and the non-light-emitting regions 60 not containing the quantum dots 14 are arranged regularly and alternately in the light-emitting layer 8D.

Thanks to such a feature, the light-emitting layer of the light-emitting device according to this fifth embodiment can diffract light generated from the quantum dots.

In order to achieve such a light-emitting layer, for example, the dispersity of the quantum dots are reduced with respect to a coating fluid, so that the quantum dots are agglomerated. Hence, the coating fluid may be applied so as to create uneven coating.

Sixth Embodiment

Described below is still another embodiment of the disclosure, with reference to FIGS. 14 and 15. Note that, for the sake of description, identical reference numerals are used to denote components having identical functions between this embodiment and the above embodiments. Such components will not be elaborated upon here.

The difference between this sixth embodiment and the above first embodiment is a configuration of the light-emitting layer. Other configurations are the same as those of the light-emitting device 1A according to the first embodiment. Such configurations will not be elaborated upon here.

Figure 14:
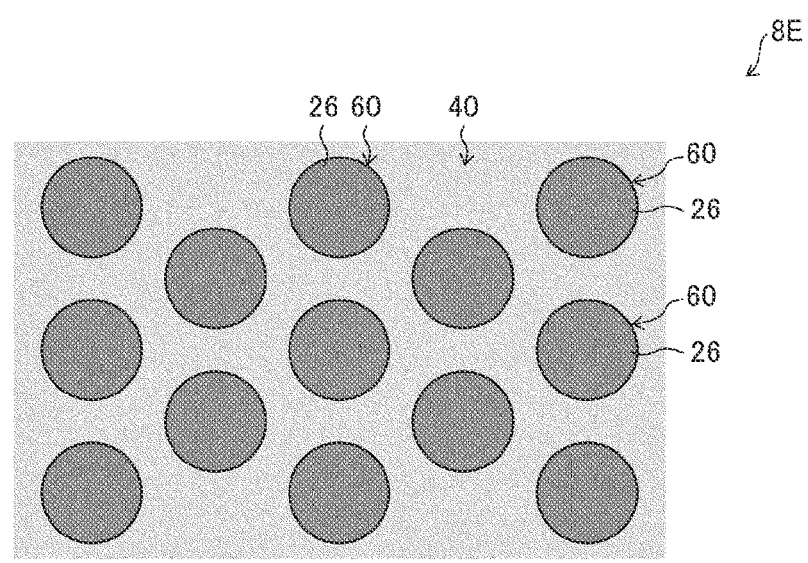
FIG. 14 is a top view of a light-emitting layer included in a light-emitting device according to a sixth embodiment that is still another embodiment of the disclosure.

FIG. 14 is a partial top view of a light-emitting layer 8E alone in a light-emitting device according to a sixth embodiment.

In the above first embodiment, the dummy flakes 16 are arranged, so that the quantum-dot-placement regions 40 are regularly arranged. In contrast, the light-emitting layer 8E of the light-emitting device according to this sixth embodiment includes the non-light-emitting regions 60 formed of photoresists 26.

Figure 15:
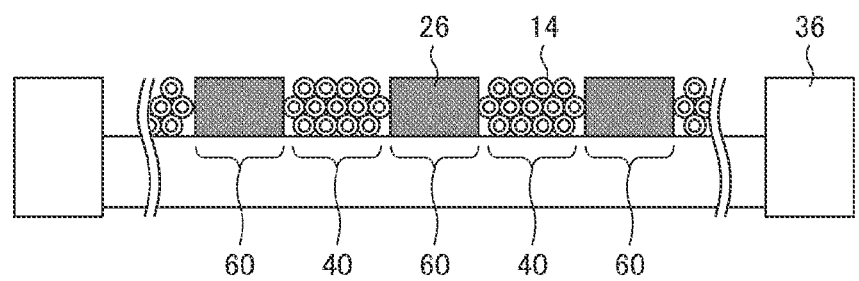
FIG. 15 is a partial cross-sectional view illustrating a process of how to form the light-emitting layer in FIG. 14.

In a step of forming the light-emitting layer 8E in this sixth embodiment 6, as illustrated in FIG. 15, a bank 36 is formed at an end of a multilayer structure (the hole-transport layer 6, the anode 4, and the array substrate 3) including the hole-transport layer 6 whose surface is provided with the light-emitting layer 8E. Next, a resist; that is, a photosensitive resin, is applied to the surface of the hole-transport layer 6 provided with the bank 36 (a first applying step). After that, the applied resist is patterned by interference exposure (a patterning step) to form a pattern of circles forming a triangular lattice on the resist (the non-light-emitting regions 60). After that, a fluid disperse is applied to fill the spacing between the non-light-emitting regions 60 (a second applying step). Here, dispersed in the fluid disperse are the quantum dots 14 having a core/shell structure, and the surface of the quantum dots 14 has ligands. The fluid disperse is dried (a drying step) to form the quantum-dot-placement regions 40. As a solvent of the fluid disperse, hexane or toluene can be used, for example. Such dispersants as thiol and amine may be mixed together with the fluid disperse. As a technique for the application of the fluid disperse, such a technique as spin coating or ink-jet printing can be used.

Specifically, the resist is patterned so that the photoresists 26 are arranged. Hence, the non-light-emitting regions 60 are arranged at imaginary pitches. After that, the spacing between the arranged non-light-emitting regions 60 is filled with the quantum dots 14. Such a feature allows the quantum-dot-placement regions 40 to be arranged regularly.

Here, the arrangement pattern of the photoresists 26 may be the same as that of the dummy flames 16 in the first embodiment. Alternatively, the photoresists 26 may be arranged in a line. In order to reduce luminance variation caused by diffracted light and make unevenness of the light less noticeable, or in order to release more efficiently light to be emitted outwards along the line, the photoresist may be arranged not in a line but in a similar pattern as the dummy flakes are arranged or in a vertically and horizontally latticed pattern.

Hence, an aspect of this sixth embodiment can provide the light-emitting layer 8E with a regular pattern of luminance intensity. The patterned photoresists in this sixth embodiment can beneficially provide the diffracted light with uniform luminance.

Summary

The light-emitting devices 1A, 1B, 1C, and 1D according to a first aspect of the disclosure each include: a first electrode (the anode 4); a second electrode (the cathode 12); and the light-emitting layers 8A, 8B, 8C, 8D, and 8E, all of which are provided above a substrate (the array substrate 3). The light-emitting layers 8A, 8B, 8C, 8D, and 8E each include light emitters (the quantum dots 14) localized and emitting light when a voltage is applied to the first electrode (the anode 4) and the second electrode (the cathode 12). The light-emitting layers 8A, 8B, 8C, 8D, and 8E each include: first regions (the quantum-dot placement regions 40); and second regions (the non-light-emitting regions 60 and the low-light-emitting regions 66) different from the first regions. The first regions (the quantum-dot placement regions 40) and the second regions (the non-light-emitting regions 60 and the low-light-emitting regions 66) are regularly and alternately arranged in a direction perpendicular to a normal direction of the substrate. The first regions in a layer containing the light emitters (the quantum dots 14) have a first thickness in the normal direction of the substrate (the array substrate 3), and the second regions in the layer containing the light emitters have a second thickness thinner than the first thickness in the normal direction.

In the above configuration, the light-emitting layer is similar in function to a diffraction grading emitting light in regularly different amounts in the plane of the diffraction grading. Using such a simple configuration, the light-emitting device can release light more efficiently.

The light emitting devices 1A, 1B, 1C, and 1D according to a second aspect of the disclosure each include: a first electrode (the anode 4); a second electrode (the cathode 12); and the light-emitting layers 8A, 8B, 8C, 8D, and 8E, all of which are provided above a substrate (the array substrate 3). The light-emitting layers 8A, 8B, 8C, 8D, and 8E each include light emitters (the quantum dots 14) emitting light when a voltage is applied to the first electrode (the anode 4) and the second electrode (the cathode 12). The light-emitting layers 8A, 8B, 8C, 8D, and 8E each include: first regions (the quantum-dot placement regions 40) in which the light emitters (the quantum dots 14) have a first area density; and second regions (the non-light-emitting regions 60 and the low-light-emitting regions 66) in which the light emitters (the quantum dots 14) have a second area density lower than the first area density. The first regions (the quantum-dot placement regions 40) and the second regions (the non-light-emitting regions 60 and the low-light-emitting regions 66) are regularly and alternately arranged in a direction perpendicular to a normal direction of the substrate (the array substrate 3).

Thanks to the above configuration, in the light-emitting layer, the light emitters have regularly different area densities. The amount of emitted light differs, depending on the area densities of the light emitters. The light-emitting layer is similar in function to a diffraction grading emitting light in regularly different amounts in the plane of the diffraction grading. Using such a simple configuration, the light-emitting device can release light more efficiently.

The light emitting devices 1A, 1B, 1C, and 1D according to a third aspect of the disclosure each include a plurality of pixels (R, G, B). Each of the pixels includes: a first electrode (the anode 4); a second electrode (the cathode 12); and the light-emitting layers 8A, 8B, 8C, 8D, and 8E, all of which are provided above a substrate (the array substrate 3). The light-emitting layers 8A, 8B, 8C, 8D, and 8E each include light emitters (the quantum dots 14) emitting light when a voltage is applied to the first electrode (the anode 4) and the second electrode (the cathode 12). The light-emitting layers 8A, 8B, 8C, 8D, and 8E each include: first regions (the quantum-dot placement regions 40) having a first luminance intensity; and second regions (the non-light-emitting regions 60 and the low-light-emitting regions 66) having a second luminance intensity lower than the first luminance intensity, the first regions (the quantum-dot placement regions 40) and the second regions (the non-light-emitting regions 60 and the low-light-emitting regions 66) are regularly and alternately arranged in a direction perpendicular to a normal direction of the substrate (the array substrate 3).

Thanks to the above configuration, the light-emitting layer has regularly different luminance intensities. Hence, the light-emitting layer is similar in function to a diffraction grading emitting light in regularly different amounts in the plane of the diffraction grading. Using such a simple configuration, the light-emitting device can release light more efficiently.

In the light-emitting device, of a fourth aspect, according to any one of the first to third aspects, the light-emitting layers 8A, 8B, 8C, 8D, and 8E each regularly contain the light emitters (the quantum dots 14) arranged at certain imaginary pitches.

Thanks to the above configuration, the designed imaginary pitches can readily set optical properties.

In the light-emitting device, of a fifth aspect, according to the fourth aspect, each of the certain imaginary pitches is one-half or wider than a wavelength of the light obtained from the light emitters (the quantum dots 14).

Thanks to the above configuration, at least an interference effect can be observed in the light-emitting layer.

In the light-emitting device, of a sixth aspect, according to the fourth aspect or the fifth aspect, each of the certain imaginary pitches ranges from 190 to 5,000 nm.

Thanks to the above configuration, an interference effect can be certainly observed in the light-emitting layer, and the display device can have a sufficient viewing angle.

In the light-emitting device, of a seventh aspect, according to the fourth to sixth aspects, the light-emitting layers 8A, 8B, 8C, 8D, and 8E each include the light emitters along grid lines of a hexagonal lattice in plan view.

Thanks to the above configuration, the isotropic interference effect can be obtained more isotropically.

In the light-emitting device, of an eighth aspect, according to the fourth to sixth aspects, the light-emitting layers 8A, 8B, 8C, 8D, and 8E each include the light emitters along grid lines of a rectangular lattice in plan view.

Thanks to the above configuration, a plurality of pitches are obtained, making it possible to release light more efficiently and to reduce variation in luminance because of viewing angle.

In the light-emitting device, of a ninth aspect, according to the fourth to eighth aspects, the light-emitting layer regularly contains the dummy flakes 16 emitting no light and arranged at the certain imaginary pitches.

Thanks to the above configuration, repulsion between the dummy flakes can be used in forming the imaginary pitches.

In the light-emitting device, of a tenth aspect, according to the fourth to eighth aspects, the light-emitting layer 8C contains nanoparticles (the silica nanoparticles 16a) in the second regions, and the nanoparticles (the silica nanoparticles 16a) are regularly agglomerated (the primary agglomerates 16A) at the certain imaginary pitches.

Thanks to the above configuration, agglomeration of the nanoparticles can be used in forming the imaginary pitches.

In the light-emitting device, of an eleventh aspect, according to the tenth aspect, the nanoparticles are semiconductor nanoparticles emitting no light.

Thanks to the above configuration, low-cost materials such as silica particles can be used as the nanoparticles.

In the light-emitting device, of a twelfth aspect, according to the fourth to eighth aspects, the second regions (the non-light-emitting regions 60 and the low-light-emitting regions 66) contain a photosensitive resin, and the light-emitting layer 8E regularly includes the photosensitive resin provided at the certain imaginary pitches.

Thanks to the above configuration, photolithography can be used in forming the imaginary pitches. Moreover, the pitches can be designed precisely.

In the light-emitting device, of a thirteenth aspect, according to the first to twelfth aspects, the light emitters are semiconductor nanoparticles.

Thanks to the above configuration, the quantum dots can be used as the light emitters.

In the light-emitting device, of a fourteenth aspect, according to the first to twelfth aspects, the light emitters are either an organic fluorescent material or an organic phosphorescent material.

Thanks to the above configuration, the organic EL materials can be used as the light emitters.

In the light-emitting device, of a fifteenth aspect, according to the tenth aspect, the light emitters are semiconductor nanoparticles (the quantum dots 14), and the nanoparticles are other semiconductor nanoparticles lower in light emission efficiency than the semiconductor nanoparticles (the quantum dots 14).

Thanks to the above configuration, the light emitters are higher in luminance than non-light-emitting materials.

A sixteenth aspect of the disclosure relates to a method for manufacturing the light-emitting devices 1A, 1B, 1C and 1D each including a first electrode (the anode 4), a second electrode (the cathode 12), and the light-emitting layers 8A, 8B, 8C, 8D, and 8E, all of which are provided above a substrate. The light-emitting layers 8A, 8B, 8C, 8D, and 8E each include light emitters (the quantum dots 14) localized and emitting light when a voltage is applied to the first electrode (the anode 4) and the second electrode (the cathode 12). The method includes a forming step of forming the light-emitting layers 8A, 8B, 8C, 8D, and 8E. The light-emitting layers 8A, 8B, 8C, 8D, and 8E formed in the forming step includes: first regions (the quantum-dot placement regions 40); and second regions (the non-light-emitting regions 60 and the low-light-emitting regions 66) different from the first regions. The first regions (the quantum-dot placement regions 40) and the second regions (the non-light-emitting regions 60 and the low-light-emitting regions 66) are regularly and alternately arranged in a direction perpendicular to a normal direction of the substrate. The first regions (the quantum-dot placement regions 40) in a layer containing the light emitters have a first thickness in the normal direction of the substrate, and the second regions (the non-light-emitting regions 60 and the low-light-emitting regions 66) in the layer containing the light emitters have a second thickness thinner than the first thickness in the normal direction.

Thanks to the above features, the light-emitting layer is similar in function to a diffraction grading emitting light in regularly different amounts in the plane of the diffraction grading. Using such a simple configuration, the light-emitting device can release light more efficiently.

A seventeenth aspect of the disclosure relates to a method for manufacturing the light-emitting devices 1A, 1B, 1C and 1D each including a first electrode (the anode 4), a second electrode (the cathode 12), and the light-emitting layers 8A, 8B, 8C, 8D, and 8E, all of which are provided above a substrate (the array substrate 3). The light-emitting layers 8A, 8B, 8C, 8D, and 8E each include light emitters (the quantum dots 14) emitting light when a voltage is applied to the first electrode (the anode 4) and the second electrode (the cathode 12). The method includes a forming step of forming the light-emitting layers 8A, 8B, 8C, 8D, and 8E. The light-emitting layers 8A, 8B, 8C, 8D, and 8E each formed in the forming step include: first regions (the quantum-dot placement regions 40) in which the light emitters have a first area density; and second regions (the non-light-emitting regions 60 and the low-light-emitting regions 66) in which the light emitters have a second area density lower than the first area density. The first regions (the quantum-dot placement regions 40) and the second regions (the non-light-emitting regions 60 and the low-light-emitting regions 66) are regularly and alternately arranged in a direction perpendicular to a normal direction of the substrate (the array substrate 3).

Thanks to the above configuration, in the light-emitting layer, the light emitters have regularly different area densities. The amount of emitted light differs, depending on the area densities of the light emitters. The light-emitting layer is similar in function to a diffraction grading emitting light in regularly different amounts in the plane of the diffraction grading. Using such a simple configuration, the light-emitting device can release light more efficiently.

An eighteenth aspect of the disclosure relates to a method for manufacturing the light-emitting devices 1A, 1B, 1C, and 1D each including a plurality of pixels (R, G, B) each including a first electrode (the anode 4), a second electrode (the cathode 12), and the light-emitting layers 8A, 8B, 8C, 8D, and 8E, all of which are provided above a substrate (the array substrate 3). The light-emitting layers 8A, 8B, 8C, 8D, and 8E each include light emitters (the quantum dots 14) emitting light when a voltage is applied to the first electrode (the anode 4) and the second electrode (the cathode 12). The method includes a forming step of forming the light-emitting layers 8A, 8B, 8C, 8D, and 8E. The light-emitting layers 8A, 8B, 8C, 8D, and 8E formed in the forming step includes: first regions (the quantum-dot placement regions 40) having a first luminance intensity; and second regions (the non-light-emitting regions 60 and the low-light-emitting regions 66) having a second luminance intensity lower than the first luminance intensity. The first regions (the quantum-dot placement regions 40) and the second regions (the non-light-emitting regions 60 and the low-light-emitting regions 66) are regularly and alternately arranged in a direction perpendicular to a normal direction of the substrate (the array substrate 3).

Thanks to the above configuration, the light-emitting layer has regularly different luminance intensities. Hence, the light-emitting layer is similar in function to a diffraction grading emitting light in regularly different amounts in the plane of the diffraction grading. Using such a simple configuration, the light-emitting device can release light more efficiently.

In the method, of a nineteenth aspect, according to the sixteenth to eighteenth aspects, the forming step includes: an applying step of applying a fluid disperse in which the light emitters (the quantum dots 14) and the dummy flakes 16 are dispersed, the dummy flakes 16 emitting no light; and a drying step of drying the fluid disperse applied in the applying step. In the drying step, the dummy flakes 16 repel one another because of zeta potential of the dummy flakes 16, and are regularly arranged at certain imaginary pitches so that the second regions (the non-light-emitting regions 60 and the low-light-emitting regions 66) are formed.

Thanks to the above configuration, the dummy flakes are arranged by themselves and the imaginary pitches are formed, by simply drying a solution in which the dummy flakes are dispersed.

In the method, of a twentieth aspect, according to the sixteenth to eighteenth aspects, the forming step includes: an applying step of applying a fluid disperse in which the light emitters (the quantum dots 14) and nanoparticles (silica nanoparticles 16a) are dispersed; and a drying step of drying the fluid disperse applied in the applying step. In the drying step, the nanoparticles (silica nanoparticles 16a) forming primary agglomerates are regularly arranged at certain imaginary pitches so that the second regions (the non-light-emitting regions 60 and the low-light-emitting regions 66) are formed.

Thanks to the above configuration, the dummy flakes are arranged by themselves and the imaginary pitches are formed, by simply drying a fluid disperse in which the primary agglomerates are dispersed.

In the method, of a twenty first aspect, according to the sixteenth to eighteenth aspects, the forming step includes: a first applying step of applying a photosensitive resin; a patterning step of patterning the photosensitive resin, applied in the first applying step, at certain imaginary pitches; a second applying step of applying a fluid disperse to spacing of the photosensitive resin patterned in the patterning step, the fluid disperse including the light emitters (the quantum dots 14) dispersed; and a drying step of drying the fluid disperse applied in the second applying step.

Thanks to the above configuration, photolithography can be used to form the imaginary pitches. Moreover, the pitches can be designed precisely.

In the method, of a twenty second aspect, according to the twentieth aspect, the drying in the drying step allows the primary agglomerates, formed of the nanoparticles (the silica nanoparticles 16a) and regularly arranged at imaginary pitches, to break up and settle down so that the second regions (the non-light-emitting regions 60 and the low-light-emitting regions 66) are formed.

The disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the disclosure. Moreover, the technical aspects disclosed in each embodiment may be combined to achieve a new technical feature.

The invention claimed is:

1. A light-emitting device, comprising:
a first electrode; a second electrode; and a light-emitting layer, all of which are provided above a substrate, the light-emitting layer including:
a plurality of light emitters arranged between the first electrode and the second electrode;
first regions; and
second regions different from the first regions, the first regions and the second regions being alternately arranged in a direction perpendicular to a normal direction of the substrate, wherein at least one of:
(i) the first regions, including first light emitters, have a first thickness in the normal direction, and the second regions, including second light emitters, have a second thickness in the normal direction, the second thickness being thinner than the first thickness, or
(ii) the first light emitters in the first regions have a first area density, and the second light emitters in the second regions have a second area density that is lower than the first area density, or
(iii) the first regions have a first luminance intensity, and the second regions have a second luminance intensity that is lower than the first luminance intensity,
the light-emitting layer includes the plurality of light emitters arranged at certain imaginary pitches, and
each of the certain imaginary pitches ranges from 190 to 5,000 nm.

2. The light-emitting device according to claim 1, wherein each of the certain imaginary pitches is one-half or wider than a wavelength of light obtained from the plurality of light emitters.

3. The light-emitting device according to claim 1, wherein the light-emitting layer includes the plurality of light emitters along grid lines of a hexagonal lattice in a plan view.

4. The light-emitting device according to claim 1, wherein the light-emitting layer includes the plurality of light emitters along grid lines of a rectangular lattice in a plan view.

5. The light-emitting device according to claim 1, wherein the light-emitting layer further includes dummy flakes emitting no light and arranged at the certain imaginary pitches.

6. The light-emitting device according to claim 1, wherein the light-emitting layer further includes nanoparticles in the second regions, and
the nanoparticles are agglomerated at the certain imaginary pitches.

7. The light-emitting device according to claim 6, wherein the nanoparticles are semiconductor nanoparticles emitting no light.

8. The light-emitting device according to claim 1, wherein the second regions further include a photosensitive resin, and
the light-emitting layer includes the photosensitive resin provided at the certain imaginary pitches.

9. The light-emitting device according to claim 1, wherein the plurality of light emitters comprises semiconductor nanoparticles.

10. The light-emitting device according to claim 1, wherein
the plurality of light emitters comprises either an organic fluorescent material or an organic phosphorescent material.

11. The light-emitting device according to claim 6, wherein
the plurality of light emitters comprises semiconductor nanoparticles, and
the nanoparticles are other semiconductor nanoparticles lower in light emission efficiency than the semiconductor nanoparticles.

12. A light-emitting element, comprising:
a plurality of pixels, wherein
each of the plurality of pixels includes: a first electrode; a second electrode; and a light-emitting layer, all of which are provided above a substrate, the light-emitting layer including:
a plurality of light emitters arranged between the first electrode and the second electrode;
first regions; and
second regions different from the first regions, the first regions and the second regions being alternately arranged in a direction perpendicular to a normal direction of the substrate, each of the second regions including at least one dummy flake, while none of the first regions includes a dummy flake.

13. The light-emitting element according to claim 12, wherein the light-emitting layer includes the plurality of light emitters along grid lines of a hexagonal lattice in a plan view.

14. The light-emitting element according to claim 12, wherein each dummy flake emits no light and is arranged at a certain imaginary pitch, and the certain imaginary pitch ranges from 190 to 5,000 nm.

15. The light-emitting element according to claim 12, wherein the light-emitting layer further includes nanoparticles to replace the at least one dummy flake in the second regions, the nanoparticles are agglomerated at certain imaginary pitches, and each of the certain imaginary pitches ranges from 190 to 5,000 nm.

16. The light-emitting device according to claim 12, wherein the light-emitting layer includes the plurality of light emitters along grid lines of a rectangular lattice in a plan view.

17. The light-emitting device according to claim 12, wherein the second regions further include a photosensitive resin, the light-emitting layer includes the photosensitive resin provided at certain imaginary pitches, and each of the certain imaginary pitches ranges from 190 to 5,000 nm.

18. The light-emitting device according to claim 12, wherein the plurality of light emitters comprises semiconductor nanoparticles.

19. The light-emitting device according to claim 12, wherein the plurality of light emitters comprises either an organic fluorescent material or an organic phosphorescent material.

20. The light-emitting device according to claim 12, wherein at least one of:

(i) the first regions, including first light emitters, have a first thickness in the normal direction, and the second regions, including second light emitters, have a second thickness in the normal direction, the second thickness being thinner than the first thickness, or (ii) the first light emitters in the first regions have a first area density, and the second light emitters in the second regions have a second area density that is lower than the first area density, or (iii) the first regions have a first luminance intensity, and the second regions have a second luminance intensity that is lower than the first luminance intensity.

* * * * *